(12) United States Patent
Kamiya et al.

(10) Patent No.: US 9,852,879 B2
(45) Date of Patent: Dec. 26, 2017

(54) ION BEAM PROCESSING METHOD AND ION BEAM PROCESSING APPARATUS

(71) Applicant: CANON ANELVA CORPORATION, Kawasaki-shi (JP)

(72) Inventors: Yasushi Kamiya, Kawasaki (JP); Hiroshi Akasaka, Kawasaki (JP); Yuta Konno, Kawasaki (JP)

(73) Assignee: CANON ANELVA CORPORATION, Kawasaki-Shi (JP)

( * ) Notice: Subject to any disclaimer, the term of this patent is extended or adjusted under 35 U.S.C. 154(b) by 284 days.

(21) Appl. No.: 14/751,903

(22) Filed: Jun. 26, 2015

(65) Prior Publication Data

US 2015/0303028 A1 Oct. 22, 2015

Related U.S. Application Data

(63) Continuation of application No. PCT/JP2013/006712, filed on Nov. 15, 2013.

(30) Foreign Application Priority Data

Mar. 8, 2013 (JP) ................................. 2013-046705

(51) Int. Cl.
*H01J 37/04* (2006.01)
*H01J 37/24* (2006.01)
(Continued)

(52) U.S. Cl.
CPC .......... *H01J 37/243* (2013.01); *H01J 37/045* (2013.01); *H01J 37/08* (2013.01); *H01J 37/20* (2013.01);
(Continued)

(58) Field of Classification Search
CPC .......... H01J 37/045; H01J 37/09; H01J 37/20; H01J 37/243; H01J 37/305; H01J 37/3056; H01J 37/32422
See application file for complete search history.

(56) References Cited

U.S. PATENT DOCUMENTS 4,870,284 A * 9/1989 Hashimoto ............. H01J 27/14
250/423 F
5,462,629 A * 10/1995 Kubota ................ H01J 37/3053
156/345.55
(Continued)

FOREIGN PATENT DOCUMENTS

JP 256833 A 2/1990
JP 02056833 A * 2/1990
(Continued)

OTHER PUBLICATIONS

International Search Report in PCT/JP2013/006712, dated Feb. 4, 2014 (2 pages).

*Primary Examiner* — Wyatt Stoffa
(74) *Attorney, Agent, or Firm* — Fitzpatrick, Cella, Harper & Scinto

(57) ABSTRACT

An ion beam etching method includes applying a positive voltage for extracting ions into a vacuum container to a first electrode, under a first condition where irradiation of a substrate with an ion beam is blocked off by a shutter, generating plasma in an internal space under the first condition, forming the ion beam by forming, under the first condition, a second condition where a positive voltage is applied to the first electrode and a negative voltage is applied to a second electrode, and moving the shutter and processing the substrate by irradiating the substrate with the ion beam.

7 Claims, 8 Drawing Sheets

(51) Int. Cl.
*H01J 37/08* (2006.01)
*H01J 37/305* (2006.01)
*H01J 37/20* (2006.01)
*H01J 37/32* (2006.01)

(52) U.S. Cl.
CPC ........ *H01J 37/305* (2013.01); *H01J 37/3056* (2013.01); *H01J 37/32422* (2013.01)

(56) References Cited

U.S. PATENT DOCUMENTS

| | | | | |
|---|---|---|---|---|
| 6,610,987 | B2* | 8/2003 | Kimura | H01J 37/3053 250/398 |
| 8,053,747 | B2* | 11/2011 | Abarra | H01J 37/317 250/492.1 |
| 8,378,576 | B2 | 2/2013 | Abarra et al. | |
| 2002/0175296 | A1 | 11/2002 | Kimura et al. | |
| 2003/0030009 | A1* | 2/2003 | Tanaka | H01J 27/08 250/423 R |
| 2007/0007243 | A1* | 1/2007 | Horita | B82Y 10/00 216/66 |
| 2012/0145535 | A1* | 6/2012 | Kamiya | H01J 37/302 204/192.34 |
| 2012/0211166 | A1* | 8/2012 | Yevtukhov | H01J 27/18 156/345.51 |
| 2014/0124363 | A1* | 5/2014 | Abarra | H01J 37/32412 204/298.04 |

FOREIGN PATENT DOCUMENTS

| | | |
|---|---|---|
| JP | 6176728 A | 6/1994 |
| JP | 10321175 A | 12/1998 |
| JP | 2009-211955 A | 9/2009 |
| JP | 2011-124215 A1 | 6/2011 |
| JP | 2012-129224 A | 7/2012 |

* cited by examiner

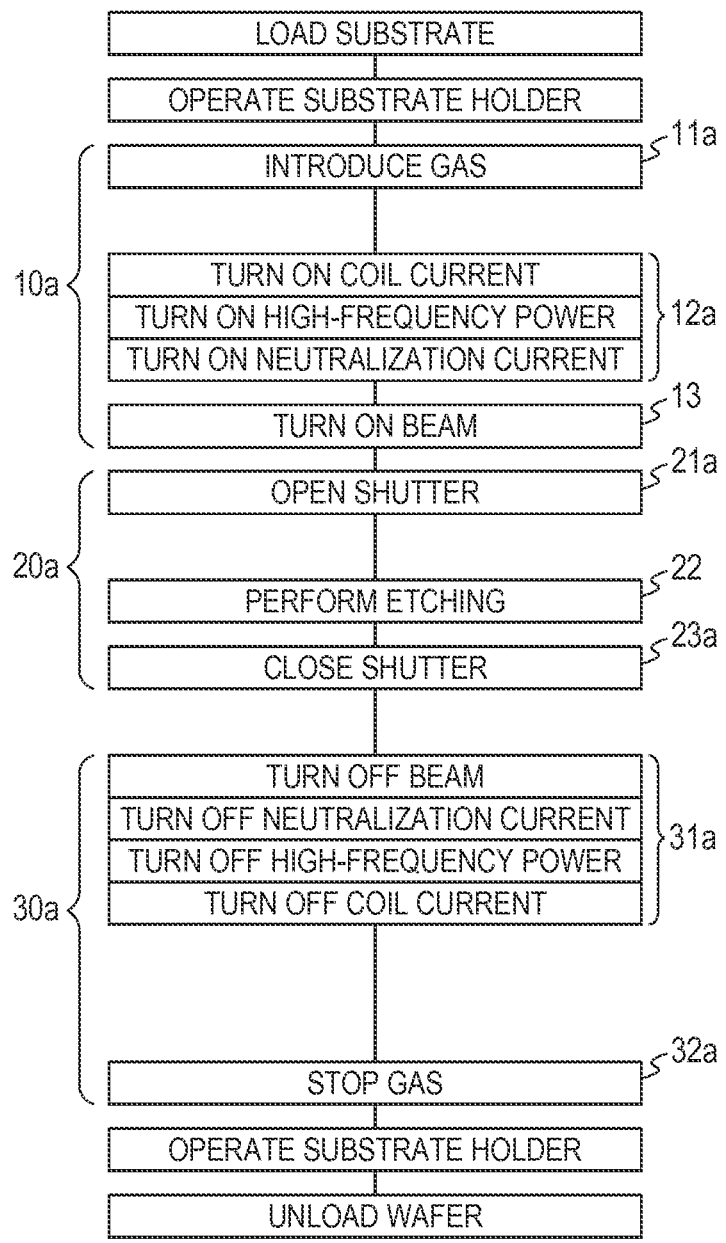

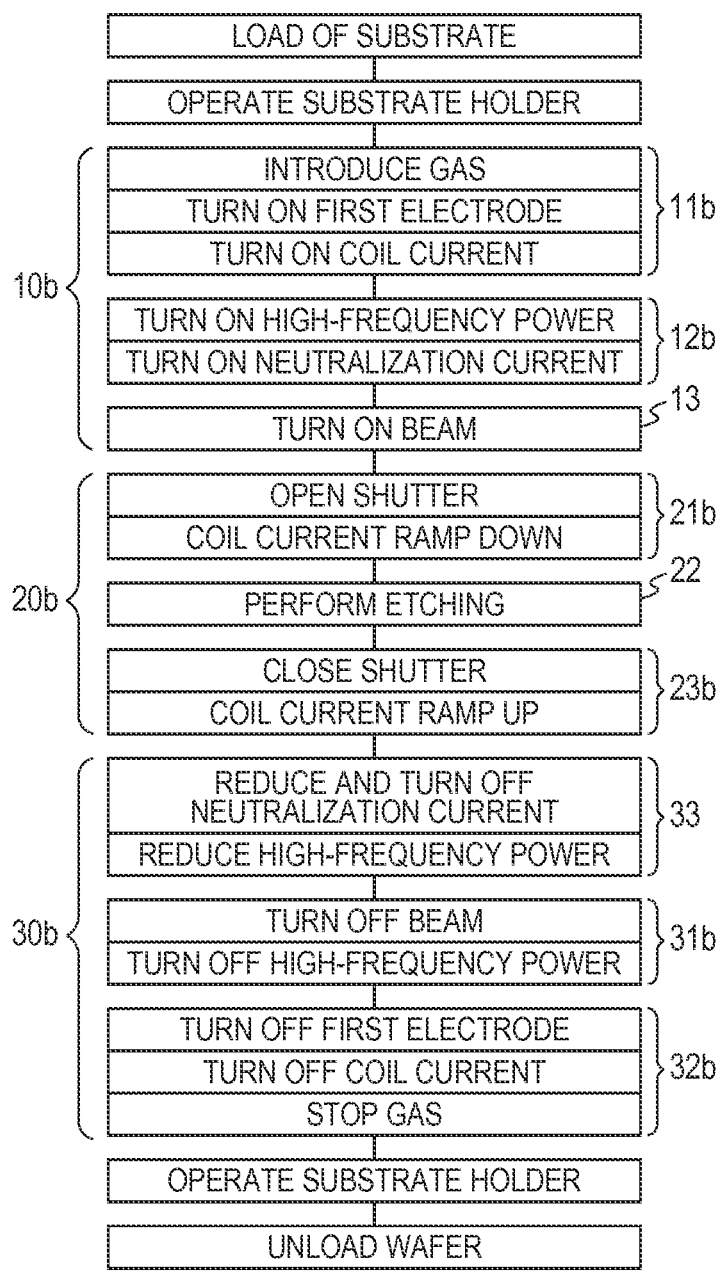

ION BEAM PROCESSING METHOD AND ION BEAM PROCESSING APPARATUS

CROSS-REFERENCE TO RELATED APPLICATIONS

This application is a continuation application of International Application No. PCT/JP2013/006712, filed Nov. 15, 2013, which claims the benefit of Japanese Patent Application No. 2013-046705 filed Mar. 8, 2013. The contents of the aforementioned applications are incorporated herein by reference in their entireties.

TECHNICAL FIELD

The present invention relates to an ion beam processing method and an ion beam processing apparatus, and more particularly to an ion beam processing method and an ion beam processing apparatus capable of reducing occurrence of electrostatic damage (ESD) on a substrate as an ion beam processing target.

BACKGROUND ART

One of widely-used methods for ion beam processing is an ion beam etching (hereinafter also called IBE) process, which etches a substrate mounted on a substrate holder by irradiating positive ions (or ion beam) to the substrate. An IBE apparatus includes an ion source (or an ion beam generation source) configured to extract positive ions from plasma by an extraction electrode, and a substrate holder disposed opposed to the ion source, and configured to hold a substrate in a vacuum. Generally, the IBE apparatus further includes an electron source (or a neutralizer) configured to emit electrons to the positive ions extracted from the ion source, a shutter device disposed between the ion source and the substrate holder and configured to block off the ion beam, and an evacuation device configured to evacuate a processing chamber to produce a vacuum in the processing chamber (Refer to U.S. Patent Application Publication No. 2002/0175296.)

A substrate is etched by the extracted ion beam. During this etching, a positive potential is induced in the substrate by the ion beam of a positive charge. The positive potential may cause damage to an insulating film formed on the substrate. Generally, the damage to a substrate element is called electrostatic damage (ESD). In particular, an element having an insulating film of a few nanometers, such as a TMR (Tunnel Magneto-Resistance) element, may undergo the electrostatic damage, and thus, it is desirable that substrate potential variations be suppressed in a processing step for such an element.

During the etching process, fluctuations of the substrate potential are suppressed by emitting electrons for neutralizing the positive potential between an extraction electrode and the substrate. The electrons for neutralization are emitted from the neutralizer located near the extraction electrode of the ion source. The amount of electrons emitted is adjusted so that the substrate potential may reach a predetermined value. The start and end of the etching process are controlled by opening and closing a shutter of the above-described shutter device. During operation of the shutter, the amounts of ion beam and electrons incident on the substrate both individually vary according to a shutter aperture. At this time, the substrate potential varies if the amounts of ion beam and electrons incident on the substrate get out of balance.

In this regard, there has been known a technique for suppressing the fluctuations of the substrate potential depending on an operation state of the shutter for blocking off the ion beam emitted from the ion source (Refer to U.S. Patent Application Publication No. 2002/0175296 and Japanese Patent Application Laid-Open No. 2012-129224).

U.S. Patent Application Publication No. 2002/0175296 discloses a technique for reducing fluctuations of the substrate potential by controlling an output from the ion source during an opening operation of the shutter. Specifically, U.S. Patent Application Publication No. 2002/0175296 discloses that, in order to solve insufficient neutralization of the substrate potential during the opening of the shutter, the amount of ion beam emission or an acceleration voltage of the ion beam is controlled to be reduced in opening and closing of the shutter.

Japanese Patent Application Laid-Open No. 2012-129224 discloses that the fluctuations of the substrate potential caused during the opening and closing operation of the shutter are suppressed by adjusting the amount of electrons (or a neutralization current) emitted from the neutralizer according to the opening and closing operation of the shutter.

However, the fluctuations of the substrate potential also occur at any time other than during the opening and closing operation of the shutter. When the ion source forms plasma with the shutter closed, the plasm is diffused through an opening of the extraction electrode into a processing space. At this time, because of a difference in mobility between electrons and ions, the electrons reach the substrate earlier, and the substrate is charged with a negative voltage during until positive ions reach the substrate. Thus, even if the shutter is closed, the substrate potential fluctuates by the influence of electrons of the plasm leaking out from the ion source.

The fluctuations of the substrate potential are caused by the fact that the shutter does not completely shield the substrate from the ion source. For example, an apparatus applied in U.S. Patent Application Publication No. 2002/0175296 is configured so that the shutter device can completely block off the ion beam and electrons from a substrate-side space in principle, and thus, when the shutter is closed, the ion beam and the electrons (i.e. the plasma) are confined in a narrow hermetically-closed space between the ion source and the shutter. In this case, since the ion source is completely isolated from the substrate as mentioned above, a minus potential is unlikely to occur on the substrate when the shutter is closed. However, actually, a gap between a movable shutter and a chamber cannot be eliminated, and thus, electrons from the ion source side may be emitted through the gap to the substrate side, and it is difficult to eliminate the occurrence of the minus potential. Also, in such an apparatus in which the movable shutter cannot isolate the ion source and the substrate, the plasm leaking out from the ion source is emitted to the substrate side through a gap between the shutter and an inner wall of the chamber, and thus, the shutter increases a distance traveled by the electrons and ions from the ion source to the substrate. Thus, a further difference arises between the time taken for the ions of the plasm leaking out from the ion source to reach the substrate and the time taken for the electrons of the plasm to reach the substrate. Therefore, the problem of instability of the substrate potential may become more noticeable.

Also, in a shutter device which does not shield a substrate-side space from a plasma formation space even when the shutter is closed as disclosed in Japanese Patent Application Laid-Open No. 2012-129224, or equivalently, in a shutter device which does not block off the routing of the plasma to the substrate even when the shutter is closed, there exists the problem of being incapable of suppressing the occurrence of the minus substrate potential.

Such charge-up of the substrate may cause dielectric breakdown of an element or the like formed on the substrate. Heretofore, this minus potential has not become a serious problem, but suppression of the minus potential becomes necessary as the element becomes finer.

SUMMARY OF INVENTION

The present invention is made in view of the above-mentioned problems. An object of the present invention is to provide an ion beam processing method and an ion beam processing apparatus capable of reducing substrate potential fluctuations caused by plasma in ion beam generation in ion beam processing using shutter.

In order to attain the above object, according to a first aspect of the present invention, there is provided an ion beam processing method for processing a substrate placed in a processing chamber linked to a plasma generation chamber by irradiating the substrate with an ion beam extracted and formed from plasma generated in the plasma generation chamber having an internal space, including applying a positive voltage for extracting ions into the processing chamber to a first electrode disposed facing the internal space, in a portion of linkage between the plasma generation chamber and the processing chamber, under a first condition where irradiation of the substrate with the ion beam is blocked off by a shutter, generating the plasma in the internal space under the first condition, forming the ion beam by forming, under the first condition, a second condition where a positive voltage is applied to the first electrode and a negative voltage is applied to a second electrode disposed closer to the processing chamber than the first electrode, in the portion of linkage, and moving the shutter and processing the substrate by irradiating the substrate with the ion beam.

According to a second aspect of the present invention, there is provided an ion beam processing apparatus including a plasma generation chamber having an internal space, a processing chamber linked to the plasma generation chamber, a plasma generation unit configured to generate plasma in the internal space, an extraction unit configured to extract ions from the plasma in the internal space into the processing chamber, the extraction unit including a first electrode and a second electrode each having ion passage holes for passage of the ions, the first electrode being disposed closest to the plasma generation chamber, the second electrode being disposed closer to the processing chamber than the first electrode is, a substrate holding unit disposed in the processing chamber, having a substrate holding surface for holding a substrate, and being disposed so that an ion beam extracted and formed from the extraction unit is incident on the substrate holding unit, a shutter disposed between the extraction unit and the substrate holding unit, and configured to move between a first position in which the ion beam is blocked off from the substrate holding surface and a second position in which the ion beam is not blocked off from the substrate holding surface, a voltage supply unit that applies voltages to the first electrode and the second electrode, and a controller configured to control the voltage supply unit so as to apply a positive voltage to the first electrode under a condition where the shutter is in the first position before generation of the plasma and before formation of the ion beam, and apply a positive voltage to the first electrode and a negative voltage to the second electrode during the formation of the ion beam.

According to a third aspect of the present invention, there is provided a control device for an ion beam processing apparatus including a plasma generation chamber having an internal space, a processing chamber linked to the plasma generation chamber, a plasma generation unit configured to generate plasma in the internal space, an extraction unit configured to extract ions from the plasma in the internal space into the processing chamber, the extraction unit including a first electrode and a second electrode each having ion passage holes for passage of the ions, the first electrode being disposed closest to the plasma generation chamber, the second electrode being disposed closer to the processing chamber than the first electrode is, a substrate holding unit disposed in the processing chamber, having a substrate holding surface for holding a substrate, and being disposed so that an ion beam extracted and formed from the extraction unit is incident on the substrate holding unit, a shutter disposed between the extraction unit and the substrate holding unit, and configured to move between a first position in which the ion beam is blocked off from the substrate holding surface and a second position in which the ion beam is not blocked off from the substrate holding surface, and a voltage supply unit configured to apply predetermined voltages to the first electrode and the second electrode, respectively, the control device including a means for controlling the voltage supply unit so as to apply a positive voltage to the first electrode, under a condition where the shutter is in the first position, before generation of the plasma and before formation of the ion beam, and a means for controlling the voltage supply unit so as to, during the formation of the ion beam, apply a positive voltage to the first electrode and apply a negative voltage to the second electrode.

According to the present invention, regardless of a shape of the shutter, substrate potential variations can be reduced, so that the occurrence of ESD can be reduced. Thus, quality of an element formed on the substrate can be stabilized.

BRIEF DESCRIPTION OF DRAWINGS

FIG. 5A is a flowchart of a control process which is executed in a conventional ion beam etching apparatus.

FIG. 5B is a flowchart of a control process which is executed in the ion beam etching apparatus according to one embodiment of the present invention.

DESCRIPTION OF EMBODIMENTS

Figure 1:
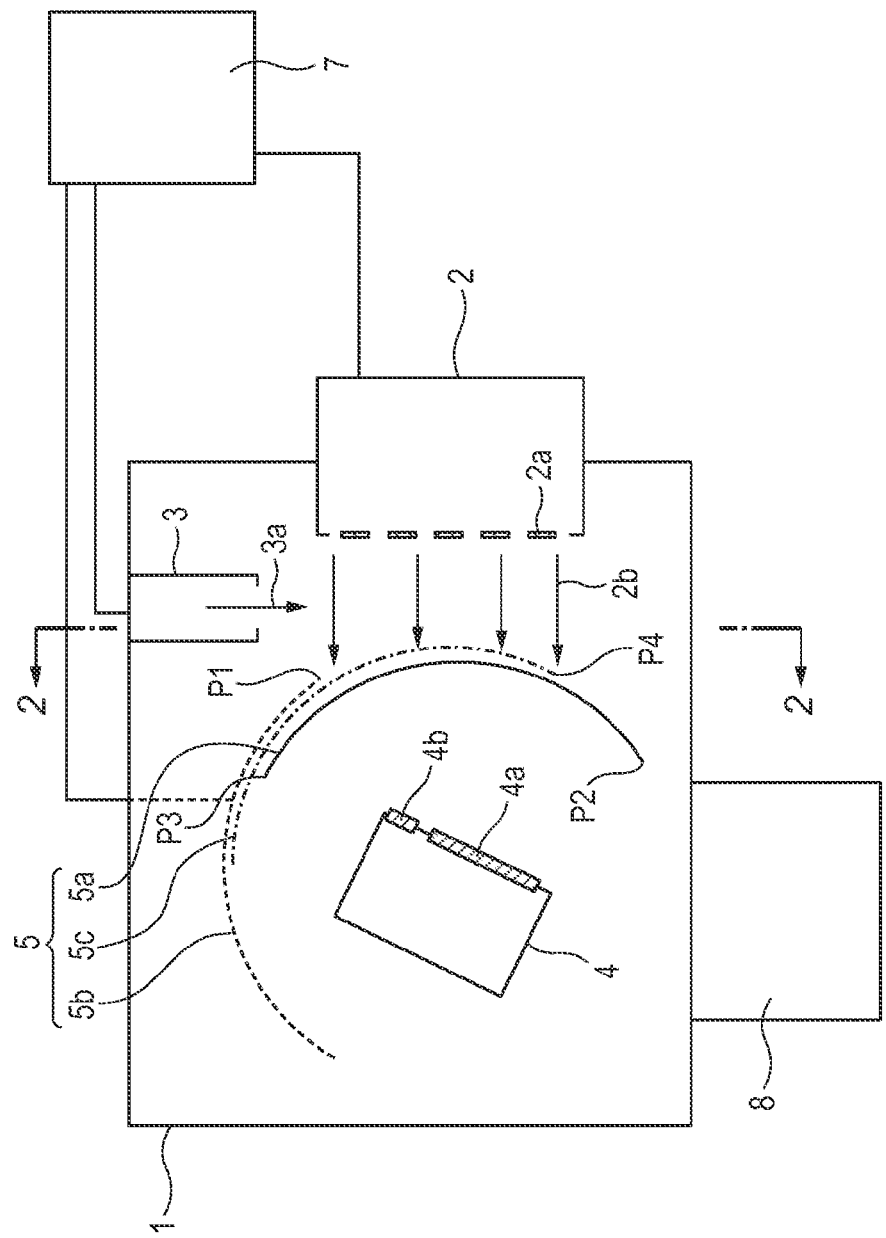
FIG. 1 is a schematic diagram of an ion beam etching apparatus according to one embodiment of the present invention.

Although an embodiment of the present invention will be described below with reference to the drawings, the present invention is not limited to the embodiment. In the drawings described below, parts having the same functions are indicated by the same reference numerals, and repeated description of the parts may be omitted.

Figure 2:
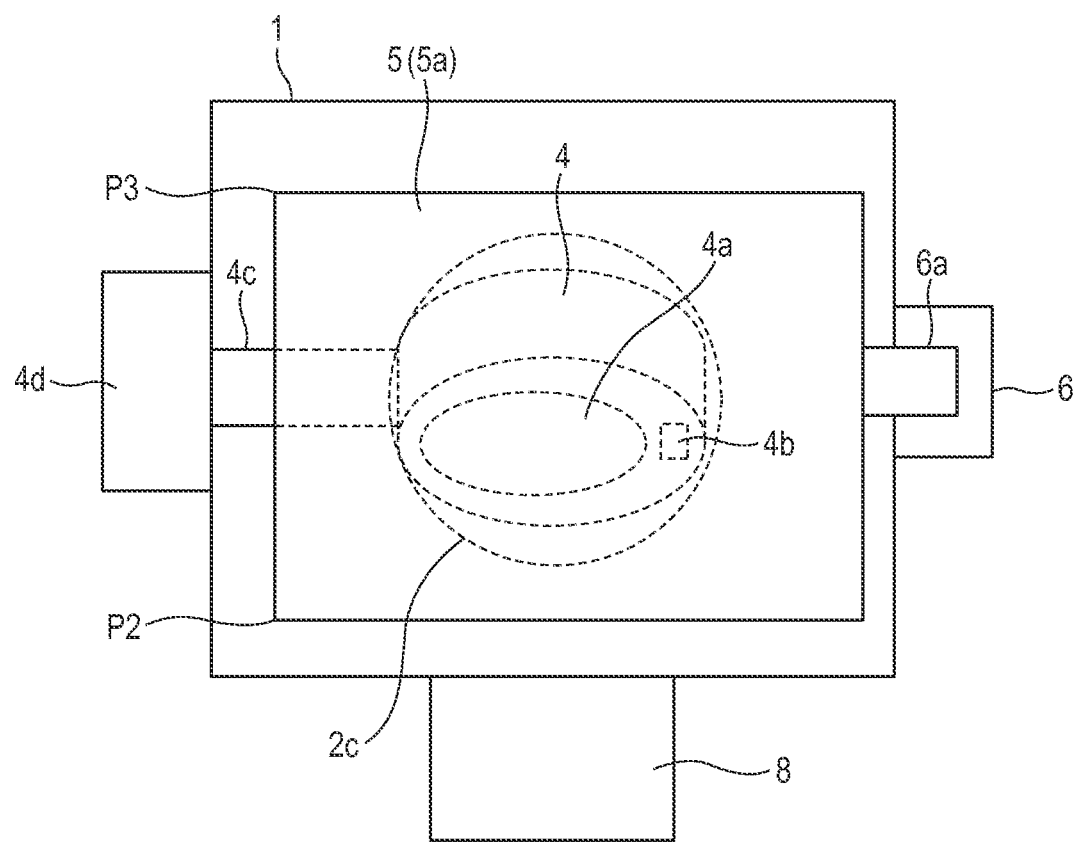
FIG. 2 is a cross-sectional view taken in the direction of the arrows along the line I-I of FIG. 1.
Figure 3:
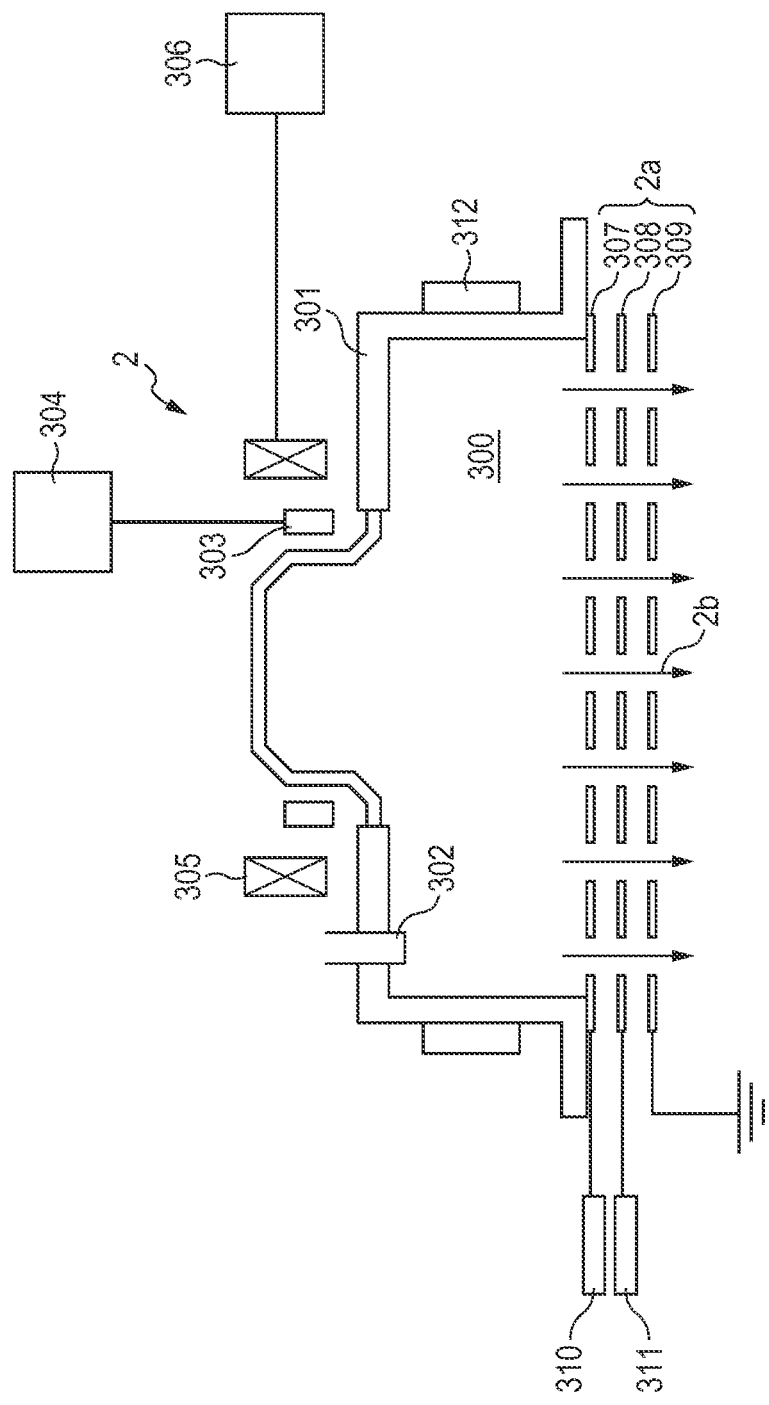
FIG. 3 is a schematic diagram of an ion source according to one embodiment of the present invention.
Figure 4:
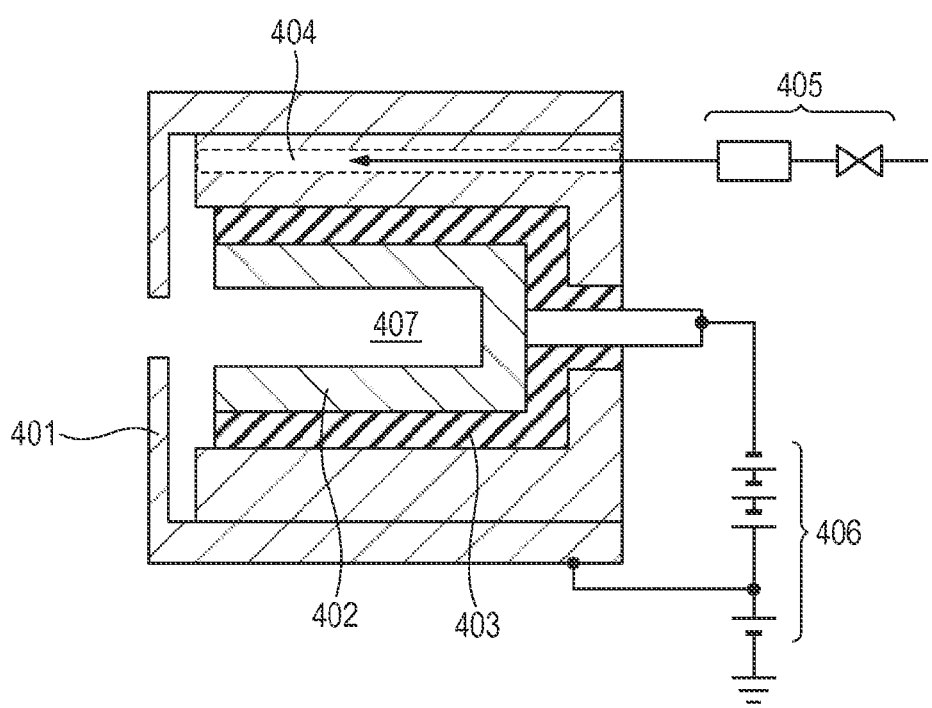
FIG. 4 is a schematic diagram of a neutralizer according to one embodiment of the present invention.
Figure 6:
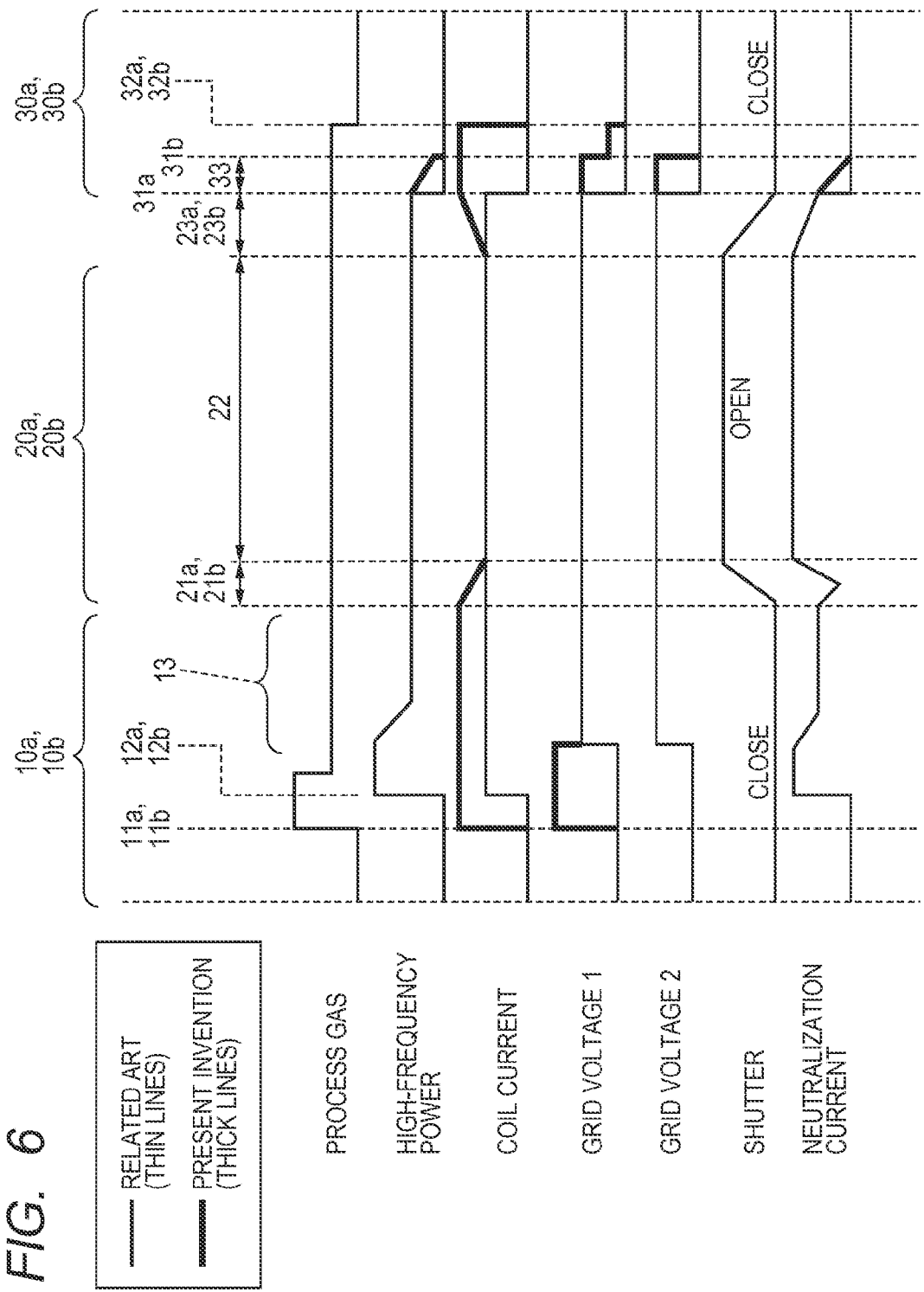
FIG. 6 is a timing chart of a control element which is executed in the ion beam etching apparatus according to one embodiment of the present invention.
Figure 7:
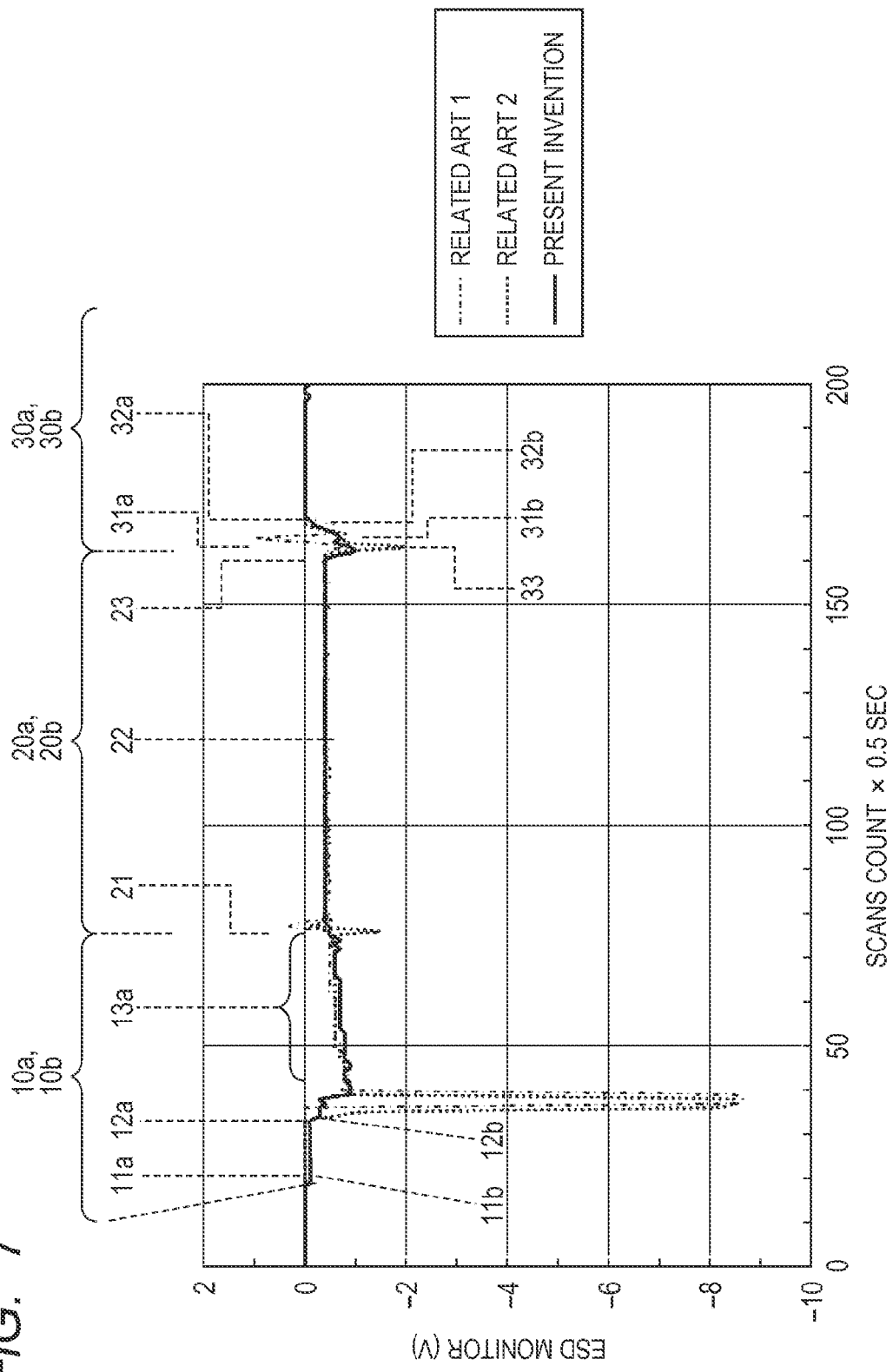
FIG. 7 is a graph illustrating measured results of a substrate potential throughout the whole control process according to one embodiment of the present invention.

FIGS. 1 to 7 are figures of assistance in explaining an ion beam etching apparatus or an ion beam etching method according to one embodiment of the present invention. FIG. 1 is a schematic diagram of an ion beam etching apparatus according to one embodiment of the present invention, FIG. 2 is a cross-sectional view taken in the direction of the arrows along the line I-I of FIG. 1, FIG. 3 is a schematic diagram of an ion source of FIG. 1, FIG. 4 is a schematic diagram of a neutralizer of FIG. 1, and FIG. 5B is a flowchart of a control process which is executed in one embodiment of the present invention. Also, FIG. 6 is a timing chart of a control element which is executed in one embodiment of the present invention, and FIG. 7 is a graph illustrating measured results of a substrate potential throughout the whole control process when one embodiment of the present invention is implemented. Note that a diagram of apparatus configuration will be omitted exclusive of part, in order to prevent complexity of the drawings.

Firstly, description will be given with reference to FIGS. 1 to 3 with regard to a general configuration of the ion beam etching apparatus according to one embodiment of the present invention. In FIG. 2, a substrate holder 4 and the like located on the underside of a shutter 5 are indicated by dotted lines. The ion beam etching apparatus is an apparatus configured to extract ions from plasma generated in a plasma generation chamber thereby to form an ion beam. The ion beam etching apparatus according to the embodiment includes a vacuum container 1 as a processing chamber, anion source 2 configured to extract positive ions (or an ion beam 2b) from plasma by an extraction electrode 2a, and a neutralizer 3 configured to emit electrons 3a (or neutralization electrons) for neutralizing a substrate potential. Also, the ion beam etching apparatus includes the substrate holder 4 configured to hold a substrate 4a at a position capable of irradiation with the ion beam 2b from the ion source 2, a shutter device 6 disposed at a midpoint position between the ion source 2 and the substrate holder 4 and configured to block off the ion beam 2b by the shutter 5, and an evacuation device 8 configured to evacuate the vacuum container 1 to produce a vacuum in the vacuum container 1. Also, the neutralizer 3, portions of the ion source 2, the substrate holder 4, the shutter device 6 and the like are controlled by a controller 7. An ion etching process which involves emitting the ion beam 2b extracted from the plasma toward the substrate 4a mounted on the substrate holder 4 thereby to subject the substrate to etching can be performed.

In FIG. 3, the ion source 2 includes an ion source container 301 as a plasma generation chamber having an internal space 300, linked to the vacuum container 1, and being capable of generating plasma in the internal space 300, a gas introduction device 302 configured to introduce an Ar (argon) gas into the ion source container 301 (or into the internal space), a loop antenna 303 as a plasma generation unit configured to generate plasma in the ion source container 301 through a dielectric, and a high-frequency power supply 304 configured to supply high-frequency power to the loop antenna 303. Also, the ion source 2 includes an electromagnetic coil 305 configured to adjust a plasma density distribution in the ion source 2, an electromagnet power supply 306 configured to supply a predetermined current to the electromagnetic coil 305, the extraction electrode 2a capable of extracting positive ions from the plasma in the ion source container 301, and a permanent magnet 312.

In the embodiment of the present invention, the extraction electrode 2a as an extraction unit is disposed in a portion of linkage between the vacuum container 1 and the ion source container 301, and includes a first electrode 307, a second electrode 308 and a third electrode 309, which are disposed in sequence from the ion source container 301 toward the substrate holder 4. The first electrode 307, the second electrode 308 and the third electrode 309 each have many ion passage holes for passage of ions. The first electrode 307 is disposed closest to the ion source container 301 (or to the plasma generation chamber). In other words, the first electrode 307 is an electrode disposed facing the internal space 300. The second electrode 308 is disposed closer to the vacuum container 1 (or to the processing chamber) than the first electrode 307, and the third electrode 309 is disposed closest to the vacuum container 1. A power supply 310 is connected to the first electrode 307, and under control of the controller 7, the power supply 310 applies a positive voltage to the first electrode 307. Also, a power supply 311 is connected to the second electrode 308, and under control of the controller 7, the power supply 311 applies a negative voltage to the second electrode 308. Thus, the power supplies 310, 311 are voltage supply units configured to supply predetermined voltages to the first electrode 307 and the second electrode 308, respectively. The third electrode 309 is grounded. The predetermined voltages are applied to the electrodes thereby to enable accelerating positive ions contained in the plasma generated in the ion source container 301 and thus extracting the ion beam 2b.

The neutralizer 3 is disposed at a position such that irradiation with the electrons 3a can be applied to the ion beam 2b emitted from the ion source 2 toward the substrate 4a. The neutralizer 3 is an electron generation device installed in order to neutralize an electric charge produced by the ion beam in an ion beam processing apparatus, and in the embodiment, the neutralizer 3 of a hollow cathode type is adopted. The neutralizer of the hollow cathode type has longer life as compared to a neutralizer using a filament, and the neutralizer of this type can achieve a high current density and high efficiency with a small plasma volume. Of course, besides the hollow cathode type, various types different in generation method, such as a filament and a microwave, may be adopted.

In FIG. 4, reference numeral 401 denotes an anode (or a positive pole), reference numeral 402 denotes a cathode (or a negative pole), and reference numeral 403 denotes an insulator for insulating the anode 401 and the cathode 402. The cathode 402 has a cylindrical shape, and the cathode 402 is opened at one end and is closed at the other end. An opening formed at the one end of the cathode 402 faces the anode 401. The cathode 402 internally has a hollow portion 407 in which plasma is formed. Although a cross-sectional shape of the hollow portion of the cathode 402 is generally circular, any shape such as an equilateral octagon or an equilateral hexagon will do, provided only that a space capable of plasma formation is present. The anode 401 and the cathode 402 are connected to a power supply 406 in order that predetermined voltages are applied to the anode 401 and the cathode 402, respectively. Reference numeral 404 denotes a gas introduction path for introduction of a discharging gas into the neutralizer, reference numeral 405 denotes a gas introduction control unit configured to control a flow rate or pressure of the discharging gas introduced into the gas introduction path 404, and the gas introduction control unit 405 is connected to a gas source (not illustrated).

The discharging gas is introduced through the gas introduction path 404 into the neutralizer, and the power supply 406 applies a negative voltage to the cathode 402, and thereby, plasma is formed in the hollow portion 407. Further, the power supply 406 applies a positive voltage to the anode 401, and thereby, electrons are extracted from the plasma through the opening of the anode 401 facing the hollow portion 407, so that the ion beam is neutralized. Titanium or molybdenum or the like is preferably used for the anode 401 and the cathode 402, for example taking into account sputtering resistance or discharging efficiency or the like. The electrons extracted through the opening of the anode 401 can be measured by detecting a current flowing through the anode 401.

The substrate holder 4 as a substrate holding unit has a substrate holding surface for holding the substrate 4a, and includes a floating electrode 4b electrically floating, located in the vicinity of the substrate holding surface and configured to monitor a surface potential. Also, the substrate holder 4 is mounted through a revolution shaft 4c in a manner capable of inclination (or revolution) and rotation with respect to the vacuum container 1. The revolution shaft 4c internally has a rotation drive shaft (not illustrated) for transmitting a rotation force for rotation to the substrate holder 4, and a power supply path (not illustrated) for power supplied to the substrate holder 4. An angle of the ion beam incident on the substrate 4a can be adjusted by inclining the substrate holder 4 by rotating the revolution shaft 4c. Rotation of the revolution shaft 4c is controlled by a holder drive device 4d mounted to the vacuum container 1.

The shutter device 6 is a device capable of continuously controlling movement of the shutter 5 from a closed position 5a to an open position 5b by a shutter drive device 6a, and includes the shutter 5 and the shutter drive device 6a. The closed position 5a is a first position in which the ion beam 2b is blocked off from the substrate holder 4 (or the substrate holding surface), and the open position 5b is a second position in which the ion beam 2b is not blocked off from the substrate holder 4. The shutter 5 is a plate-shaped member curved in a circular arc in cross section. The substrate holder 4 is disposed on the curved inner side, and the shutter 5 can be moved around the substrate holder 4 by the shutter drive device 6a. A width of the shutter 5 is configured greater than a width of the ion beam 2b emitted from the ion source 2 toward the substrate 4a.

A shutter device configured to rotate a shutter plate in the form of a flat plate, rather than the shutter 5 curved in the circular arc, may be used. However, the shutter plate used in place of the shutter 5 may be used in place of the shutter of the embodiment, provided that the shutter plate is a shutter plate configured so as not to block off routing of the plasm to the substrate side even when the shutter is closed (or when the ion beam is blocked off). However, an arcuately curved shape as the shape of the shutter 5 has the advantage of being unlikely to interfere with a structure in the vacuum container 1, as compared to the shape of the flat plate, and has the advantage of eliminating a need for a retraction space for the shutter plate since a position in which the shutter 5 is moved to the underside of the substrate holder 4 is open. Thus, the vacuum container 1 (or the ion beam etching apparatus) can be reduced in size. Also, in the ion beam etching apparatus of the embodiment, a rotation axis of the shutter 5 is arranged parallel to a rotation axis of the revolution shaft 4c; however, the rotation axis of the shutter 5 may be arranged so as to cross the rotation axis of the revolution shaft 4c.

The ion beam etching apparatus of the embodiment has a structure in which a space (or a gap between the shutter 5 and a wall surface of the vacuum container 1) is present in front of the ion source 2 and in a direction in which the ion beam 2b is not emitted, rather than a structure in which, in the closed position 5a of the shutter 5, the ion source 2, the neutralizer 3 and the shutter 5 are blocked off from one another. Thus, in the closed position 5a, the ion beam 2b, the electrons 3a and the plasma coexist in a space between the ion source 2 and the shutter 5, and the plasma and some of the electrons 3a can diffuse and thereby reach the substrate holder 4 on the underside of the shutter 5 in the closed position 5a. As employed herein, the plasma refers to the plasma in the ion source 2 diffusing and thereby passing through a hole (or an ion passage hole) in the extraction electrode 2a. Even when the shutter 5 is in the closed position 5a, the diffused electrons 3a and plasma reach the substrate 4a through the gap and then generate a negative potential on the substrate 4a.

The controller 7 is a control device capable of controlling at least the neutralizer 3, the ion source 2 and the shutter device 6, and includes a program logic controller (PLC) connected to a computer, device drivers connected in order to control devices such as the neutralizer 3 and the shutter device 6, and a recording medium recording a program recipe (or a program). Also, the controller 7 can be configured so that a signal indicating the open and closed positions of the shutter 5 (or aperture information) and an operation signal for the neutralizer 3 and the ion source 2 (or output information) can be inputted to the controller 7 as appropriate. The aperture of the shutter 5 is a value according to the amount of movement of the shutter 5, and the aperture information on the shutter 5 can be calculated based on a measured value of an encoder of a motor provided in the shutter device, and the output information on the neutralizer 3 and the ion source 2 is based on output values applied to these devices.

The floating electrode 4b is a sensor for monitoring a potential of a substrate surface (or a process surface). When a monitor voltage measured by the floating electrode 4b is a positive potential, the voltage varies according to the actual substrate potential but tends to shift toward a negative potential by about a few volts as compared to the voltage of the substrate 4a. This indicates that the amount of irradiation decreases in an outside region of the process surface of the substrate 4a, although in the ion beam etching apparatus, the ion source 2 is designed so that the amount of irradiation with the ion beam 2b is uniform on the process surface of the substrate 4a.

During the etching process, while the monitor voltage of the floating electrode 4b is monitored, a neutralization current (or an output from the neutralizer 3) can also be adjusted as appropriate so that the monitor voltage reaches a predetermined value. In this case, the monitor voltage during the etching process encounters a potential difference between the substrate 4a and the floating electrode 4b as mentioned above, and thus, the output from the neutralizer 3 can be set taking the potential difference into account.

Meanwhile, when the shutter 5 is in the closed position 5a and the substrate 4a is not irradiated with the ion beam 2b, a voltage measured by the floating electrode 4b is a negative potential. In this case, the monitor voltage measured by the floating electrode 4b is substantially equal to the substrate potential. In other words, the plasma from the ion source 2 and the electrons 3a are diffused over a wide range in the vacuum container 1, and thus, the amount of the electrons 3a is uniform on the substrate holder 4.

Description will now be given with reference to FIG. 1 with regard to a position to which the shutter 5 moves.

The open position 5b is a position in which the ion beam 2b emitted from the ion source 2 toward the substrate 4a is not blocked off. In the open position 5b, an end portion (indicated by P1 in FIG. 1) of the shutter 5 close to the ion source 2 is retracted upward of an upper end of a range of irradiation with the ion beam 2b, and the ion beam 2b and the electrons 3a reaching the substrate are not blocked off at all by the shutter 5. The range of irradiation with the ion beam 2b is a range of a cross section (i.e. a plane orthogonal to a direction of travel of the ion beam) of the ion beam 2b extracted from the ion source 2. The ion beam 2b is extracted by the extraction electrode 2a, and an area 2c of irradiation with the ion beam 2b is larger by the order of a few tens of percent than a diameter of the extraction electrode 2a by a space charge effect between the electrode and the substrate.

The closed position 5a is a position in which the ion beam 2b emitted from the ion source 2 toward the substrate 4a is blocked off. In the closed position 5a, upper and lower end portions (indicated by P2, P3 in FIGS. 1 and 2) of the shutter 5 are located extending out upward and downward of the range of irradiation with the ion beam 2b, thereby to shield a larger range than the range of irradiation with the ion beam 2b and thus block off the ion beam 2b. In the closed position 5a, a distance (or a gap) between the end portion (indicated by P2 in FIG. 1) of the shutter 5 and an inner surface of the vacuum container 1 is small, and thus, the amount of the electrons 3a reaching the substrate 4a can become smaller than that in a semi-closed position 5c during shutter operation.

The semi-closed position 5c (during the shutter operation) is a position between the closed position 5a and the open position 5b, and is a position in which an end portion (indicated by P4 in FIG. 1) of the shutter 5 coincides substantially with an edge of the range of irradiation with the ion beam 2b. In the semi-closed position 5c, the amount of the electrons 3a reaching the substrate 4a becomes larger than that in the closed position 5a. In the embodiment, a speed of movement of the shutter 5 is set constant, and the shutter device requires 1 to 2 seconds for the operating or closing operation (or movement) of the shutter 5.

Description will now be given with regard to the ion beam etching method using the above-described ion beam etching apparatus. The ion beam etching method is a process in which the above-described ion beam etching apparatus is used to irradiate the substrate 4a mounted on the substrate holder 4 with the ion beam 2b extracted from plasma generated in the ion source 2 thereby to subject the substrate to an etching process. The ion beam etching method according to the embodiment can suppress substrate potential variations before and after the opening and closing of the shutter. Description will be given below with regard to operation of the control element, which is executed.

FIGS. 5A and 6 illustrate a flowchart of a control process which is executed in conventional ion beam etching, and a timing chart of the control element, respectively. The etching process can be roughly divided into three steps: a discharge start step 10a before the opening of the shutter 5 (exclusive of the loading and unloading of the substrate 4a and the rotation and revolution operations of the substrate holder 4), an etching step 20a in which the shutter 5 is opened and closed, and a discharge stop step 30a after the closing of the shutter 5.

In FIG. 6, "process gas" refers to a gas for plasma generation, introduced into the ion source 2 by the gas introduction device 302, "high-frequency power" refers to high-frequency power supplied to the loop antenna 303 by the high-frequency power supply 304, and "coil current" refers to a current supplied to the electromagnetic coil 305 by the electromagnet power supply 306. Also, "grid voltage 1" refers to a voltage supplied to the first electrode 307 by the power supply 310, and "grid voltage 2" refers to a voltage supplied to the second electrode 308 by the power supply 311. Although the grid voltage 2 is a negative voltage, the timing chart is formed by the absolute value of the grid voltage 2 since FIG. 6 is the timing chart illustrating the ON/OFF state of the voltage. "Shutter" refers to the shutter 5, and "neutralization current" refers to a current supplied to the neutralizer 3 by the power supply 406.

Firstly, description will be given with reference to FIG. 5A with regard to a control flow of the conventional ion beam etching. In the discharge start step 10a before the opening of the shutter 5, the gas is introduced into the internal space of the ion source 2 in which plasma is generated (at step 11a), and after stabilization of pressure in a vacuum chamber, the supply of an electromagnetic coil current of the ion source 2, the supply of high-frequency power for plasma generation, and the supply of the neutralization current from the neutralizer 3 are started simultaneously to start plasma discharge (at step 12a). Preferably, the supply of the high-frequency power and the supply of the neutralization current, in particular, are started simultaneously in order to start the plasma discharge with stability. Also, the gas flow rate and the high-frequency power are set to larger amounts of supply than those in the etching step 20a in order to start the plasma discharge with stability. However, after the start of the discharge, the gas flow rate is reduced to the amount of supply used in the etching step 20a.

In next positive ion extraction (step 13), first, voltages are supplied simultaneously to the first electrode 307 and the second electrode 308. At this time, a current corresponding to extracted positive ions flows through the first electrode 307. The current flowing through the first electrode 307 is called a beam current, and the beam current is automatically adjusted to a constant value for use in the etching step, by increasing or reducing the high-frequency power. Also, in this step, the neutralization current is automatically increased or reduced so as to keep constant the potential of the floating electrode 4b.

Under a condition where the beam current and the potential of the floating electrode 4b are controlled with stability, the processing moves to the next etching step 20a. In this step, the start and end of etching are controlled by an opening step 21a and a closing step 23a of the shutter 5, and the amount of etching is determined by the time for the shutter opening step 22. The opening and closing operation of the shutter 5 requires about 2 seconds, and the amount of electrons diffused around the substrate 4a and the amount of ions applied to the substrate 4a vary according to the degree of opening and closing of the shutter 5, as described with reference to FIGS. 1 and 2. Thus, substrate potential variations occur, but in the etching step 20a, the neutralization current is automatically increased or reduced so as to always keep constant the potential of the floating electrode 4b, thereby to suppress the substrate potential variations.

After the shutter closing step 23a, the processing moves to the discharge stop step 30a. When the shutter operation is completed, the etching does not proceed, and thus, the extraction electrode voltages, the neutralization current, the high-frequency power and the coil current are shut off simultaneously to stop the plasma discharge (at step 31a). Finally, at step 32a, the gas introduction is stopped to bring a series of etching process steps to an end.

In FIG. 7, measured results of the floating electrode potential in the above-mentioned conventional ion beam etching are indicated by broken lines. Specifically, the broken lines in FIG. 7 indicate two examples (related arts 1, 2) of measured results of the substrate potential in the conventional ion beam etching process illustrated in FIGS. 5A and 6. As can be seen from FIG. 7, in the related arts, potential variations occur in the discharge start step (12a), the shutter opening and closing steps (21a, 23a) and the discharge stop step (31a).

Description will be given in sequence with regard to factors for the potential variations which occur in the steps.

Firstly, a minus potential exceeding −8 V which occurs in the discharge start step (12a) is caused by the fact that the plasma which cannot be blocked off by the shutter 5 is routed around the substrate 4a, and the minus potential is caused by electrons in the plasma leaking out from the ion source 2 and the neutralization current from the neutralizer 3. In other words, even if the shutter 5 is closed, the electrons in the plasma generated in the internal space 300 leak out through the ion passage hole formed in the extraction electrode 2a into the processing chamber, and the leaking electrons reaches the substrate 4a to thus cause the substrate potential variations. A range of the potential variations which occur in the shutter opening step (21a) is on the order of a few volts, but both plus and minus variations may occur, which reflects a balance between positive ions and electrons diffused on the substrate 4a side in process of the shutter opening operation. In particular, the plasma routed on the substrate 4a side in process of the shutter opening operation is unstable. In the shutter closing step (23a), as distinct from the case of the shutter opening, positive ions are blocked off earlier by the shutter 5, and a minus potential is generated by the plasma routed to the substrate 4a. Finally, the potential variations in the discharge stop step (31a) reflect the fact that, even if the extraction electrode voltages, the neutralization current, the high-frequency power and the coil current are shut off simultaneously, the positive ions and the neutralization current do not disappear simultaneously. In particular, the plasma discharge and the extraction electrode voltages disappear later than the neutralization current, and thus, the potential tends to vary to plus.

These potential variations occur in a short time equal to or less than 0.5 seconds, and even if the neutralization current is subjected to feedback control by the potential of the floating electrode 4b, the potential variations cannot be suppressed. In particular, when the supply and stop of plural control elements are performed simultaneously, a delay time of a control system, an operation delay of plasma load, or the like may cause a difference in timing between the start and stop of supply, and thus, desirably, the supply and stop of the control elements are performed separately.

Hereinafter, description will be given with regard to ion beam etching according to the embodiment as a solution to the potential variations in the above-described conventional ion beam etching.

FIGS. 5B and 6 illustrate a flowchart of a control process which is executed in the ion beam etching apparatus according to the embodiment, and a timing chart of a control element, respectively. In FIG. 6, portions according to the embodiment are indicated by thick lines. The etching process according to the embodiment can be roughly divided into three steps: a discharge start step 10b before the opening of the shutter 5 (exclusive of the loading and unloading of the substrate 4a and the rotation and revolution operations of the substrate holder 4), an etching step 20b in which the shutter 5 is opened and closed, and a discharge stop step 30b after the closing of the shutter.

In the embodiment, under a first condition where the irradiation of the substrate 4a with the ion beam 2b is blocked off by the shutter 5, the discharge start step 10b is performed. Specifically, in the discharge start step 10b before the opening of the shutter 5, the controller 7 controls the gas introduction device 302 to introduce an Ar gas as a gas for plasma generation into the internal space 300, and controls the power supply 310 and the electromagnet power supply 306 to, at the time of gas introduction, simultaneously supply a positive voltage to the first electrode 307 and supply a current to the electromagnetic coil 305 (at step 11b). In this step, the positive voltage applied to the first electrode 307 is a voltage for extracting ions into the vacuum container 1 as the processing chamber, and is not intended to form the ion beam 2b for use in the ion beam etching process. At this time, the positive voltage to the first electrode 307 is set higher than that in the etching step 20b, and also, a value of coil current to the electromagnetic coil 305 is set higher than that in the etching step 20b. After stabilization of pressure in the ion source container 301, the controller 7 controls the high-frequency power supply 304 and the power supply 406 to supply high-frequency power to the loop antenna 303 and apply predetermined voltages to the anode 401 and the cathode 402, respectively. Thus, the supply of the high-frequency power for plasma generation and the supply of the neutralization current from a neutralization source are started simultaneously to start plasma discharge (at step 12b). Preferably, the supply of the high-frequency power and the supply of the neutralization current, in particular, are started simultaneously in order to start the plasma discharge with stability.

Also, the gas flow rate and the high-frequency power are set to larger amounts of supply than those in the etching step in order to start the plasma discharge with stability. However, after the start of the discharge, the gas flow rate is reduced to the amount of supply used in the etching step 20b.

During the formation of the ion beam 2b, a second condition is formed where a predetermined positive voltage is applied to the first electrode 307 and a predetermined negative voltage is applied to the second electrode 308. Thus, the second condition is formed thereby to form the ion beam 2b (step 13). Specifically, the controller 7 controls the power supply 310 to set the positive voltage applied to the first electrode 307 smaller than a value applied in step 11b, and simultaneously controls the power supply 311 to supply the negative voltage to the second electrode 308. Thereby, the second condition is established to generate the ion beam 2b. At this time, a current (not illustrated) corresponding to extracted positive ions flows through the first electrode 307. The current flowing through the first electrode 307 is called a beam current, and the beam current is automatically adjusted to a constant value for use in the etching step 20b, by increasing or reducing the high-frequency power. Also, in this step, the neutralization current is automatically increased or reduced so as to keep constant the potential of the floating electrode 4b.

Under a condition where the beam current and the potential of the floating electrode 4b are controlled with stability, the processing moves to the next etching step 20b. In an opening step 21b of the shutter 5, the controller 7 controls the shutter drive device 6a to rotationally move the shutter 5 located in the closed position 5a to the open position 5b and thereby form a condition where the substrate 4a is irradiated with the ion beam 2b. In this step, during movement of the shutter 5, the controller 7 controls the electromagnet power supply 306 to continuously reduce the coil current set higher in step 11b to a desired value for etching step 22. A rate of change in the value of the coil current is automatically calculated from the set current before and after the opening and closing of the shutter 5, and the set time of opening and closing of the shutter. When the coil current is changed sharply, a ratio between electrons and ions in the vacuum container 1 having a processing space vary sharply. Meanwhile, in the embodiment, as mentioned above, the coil current applied to the electromagnetic coil 305 is changed with gradient, and thus, the amount of sharp change in the ratio between the electrons and the ions in the vacuum container 1 can be reduced.

The start and end of etching are controlled by an opening step 21b and a closing step 23b of the shutter 5, and the amount of etching is determined by the time during which the shutter 5 is in the open position 5b. The controller 7 drives the shutter drive device 6a to close the shutter 5 at the step 23b after a lapse of time for implementation of a desired amount of etching after the opening of the shutter 5 at the step 21b. In other words, the controller 7 controls the etching by managing the elapsed time after the opening of the shutter 5 at the step 21b (at step 22). In the embodiment, the opening and closing operation of the shutter 5 requires about 2 seconds, and the amount of electrons diffused around the substrate 4a and the amount of ions irradiated to the substrate 4a vary according to the degree of opening and closing of the shutter 5, as described with reference to FIGS. 1 and 2. Thus, substrate potential variations occur, but in the etching step 22, the neutralization current is automatically increased or reduced so as to always keep constant the potential of the floating electrode 4b, thereby to suppress the substrate potential variations.

In the closing step 23b of the shutter 5, the controller 7 controls the shutter drive device 6a to rotationally move the shutter 5 located in the open position 5b to the closed position 5a and thereby form a condition where the substrate 4a is not irradiated with the ion beam 2b. In this step, at the same time, the controller 7 controls the electromagnet power supply 306 to continuously increase the coil current set lower in step 21b to a desired value. A rate of change in the value of the coil current is automatically calculated from the set current before and after the opening and closing of the shutter 5, and the set time of opening and closing of the shutter.

After the shutter closing step 23b, the processing moves to the discharge stop step 30b. First, the controller 7 controls the power supply 406 to gradually reduce and turn off the neutralization current, and controls the high-frequency power supply 304 to gradually reduce the high-frequency power so that the high-frequency power reaches a smaller value than the currently set value (at step 33). In this step, the neutralization current is reduced to zero, or equivalently, driving of the neutralizer 3 is stopped. Then, the controller 7 controls the power supply 311 and the high-frequency power supply 304 to stop the supply of the negative voltage applied to the second electrode 308 and high-frequency power (at step 31b). Also, in this step, the controller 7 controls the power supply 310 to set the value of the positive voltage applied to the first electrode 307 to a smaller value than the present value and maintain the supply of the positive voltage to the first electrode 307. Then, the controller 7 controls the gas introduction device 302 to stop the gas introduction, and simultaneously controls the power supply 310 and the electromagnet power supply 306 to stop the application of the positive voltage to the first electrode 307 and the application of the coil current to the electromagnetic coil 305 (at step 32b). Thereby, a series of steps in the discharge stop step 30b come to an end. Thus, at the time of stop of the plasma discharge, this step does not change the supply of the power from process conditions at a time to stop the supply of the power, but continuously changes the supply of the power to a smaller amount of supply than the process conditions to thereafter stop the supply of the power. A rate of change in the amount of supply is automatically calculated from a difference between the time setting and the amount of supply.

The controller 7 may also be configured to have a function of continuously increasing the coil current during movement of the shutter 5 from the closed position 5a to the open position 5b, or a function of continuously reducing the coil current during movement of the shutter 5 from the open position 5b to the closed position 5a.

In FIG. 7, measured results of the floating electrode potential in the embodiment are indicated by a solid line. Specifically, the solid line in FIG. 7 indicates measured results of the substrate potential in the ion beam etching process illustrated in FIGS. 5B and 6. As can be seen from comparison with the conventional ion beam etching process indicated by the broken lines in FIG. 7, according to the embodiment, potential variations can be suppressed in the discharge start step (12b), the shutter opening and closing steps (21b, 23b) and the discharge stop step (30b).

Description will be given in sequence with regard to factors which enable suppressing the potential variations in the steps.

Firstly, the discharge start step (12b) takes place as a result of the step 11b in which before plasma generation, under the first condition where the shutter 5 is closed, a positive potential is supplied to the first electrode 307 of the extraction unit 2a to thus, at the time of start of discharge, increase the amount of supply of positive ions from the ion source 2 into the vacuum container 1 as the processing chamber. Also, in the step 11b, before the plasma generation, under the first condition where the shutter 5 is closed, the coil current (which is preferably set higher than that at the time of etching) is applied to the electromagnetic coil 305 thereby to enable increasing the amount of supply of positive ions from the ion source 2 into the vacuum container 1 and further accelerating the positive ions. Also, a coil magnetic field generated by the application of the coil current before the plasma generation achieves the effect of suppressing diffusion of the plasma and the neutralization current.

Specifically, in the embodiment, before the step 12b in which the plasma generation is started, under the first condition where the shutter 5 is closed (or in a case where the shutter 5 is in the closed position 5a), a positive voltage for extracting positive ions from plasma generated in the internal space 300 toward the processing chamber is applied to the first electrode 307 of the extraction electrode 2a, which is an electrode facing the internal space 300 (or an electrode closest to the internal space 300). Thus, when the plasma is then generated in the step 12b, the positive ions in the internal space 300 can be diffused toward the processing chamber through ion diffusion holes formed in the electrodes of the extraction electrode 2a, by the positive voltage applied to the first electrode 307. In other words, at stages before the step 13 as an ion beam generation step, the amount of supply of positive ions extracted from the ion source 2 toward the processing chamber can be increased. Further, the diffused positive ions are accelerated by the positive voltage applied to the first electrode 307. Therefore, before the step 13 as the ion beam generation step, even if electrons leak out from the plasma generated by the step 12b through the ion diffusion holes, the leaking electrons can be neutralized by the positive ions diffused by the application of the positive voltage to the first electrode 307, before the leaking ions reach the substrate 4a. Also, before the step 12b in which the plasma generation is started, the application of the positive voltage to the first electrode 307 enables reducing electrons leaking through the ion passage holes from the ion source 2 toward the vacuum container 1 as the processing chamber, even when the plasma is generated in the internal space 300. Also, the positive ions are accelerated by the positive voltage applied to the first electrode 307 to thus enable reducing the time required for the positive ions to go around the closed shutter 5 to the substrate 4a, and hence enable reducing a time lag between the positive ions and the leaking electrons at the time of arrival at the substrate 4a.

Thus, before the step 12b in which the plasma generation is started, and before the step 13 in which the ion beam is generated, the positive voltage is applied to the first electrode 307 thereby to enable diffusing the positive ions in an accelerated state from the plasma into the processing chamber, while reducing electrons leaking out from the plasma generated in the internal space 300 into the processing chamber.

Further, in the embodiment, before the step 12b in which the plasma generation is started, a magnetic field is formed in the processing chamber by the electromagnetic coil 305 for a different purpose from the purpose of adjusting the plasma density distribution in the ion source 2. By the magnetic field, electrons having high mobility in particular, of the plasma diffused from the internal space 300 to the processing chamber, are trapped. The electrons trapped by the magnetic field are incident, as they are, along the magnetic field on a chamber sidewall having a ground potential. Consequently, the electrons in the plasma leaking out from the internal space 300, reaching the substrate 4a, can be suppressed. The electrons diffused into the processing chamber can be sufficiently reduced depending on a diameter of the opening formed in the extraction electrode 2a or the voltage applied to the first electrode 307, and thus, it is not necessarily required that the magnetic field be formed.

Thus, in the embodiment, it is important that before the plasma is generated in the ion source 2, the positive ions be actively extracted from the ion source 2 toward the processing chamber (or the vacuum container 1), not for purposes of ion beam generation. Therefore, before the step 12b as a plasma generation step, at least the application of the positive voltage to the first electrode 307 as an electrode closest the plasma is essential for the application of the positive voltage for the purpose of extracting positive ions toward the processing chamber, rather than for the purpose of generating the ion beam. For example, when the voltage is applied to the second electrode 308 alone, an electric field is formed between the first electrode 307 and the second electrode 308, thus suppressing movement of the positive ions toward the processing chamber. Conversely, a positive voltage (for example, a smaller voltage than the voltage applied to the first electrode 307) may also be applied to the second electrode 308 or the third electrode 309 to such an extent that the positive voltage does not interfere with the movement of the positive ions from the plasma generated in the internal space 300 toward the processing chamber.

Next, the shutter opening and closing steps (21b, 23b) also enable suppressing the diffusion of the plasma and the neutralization current during the shutter opening and closing operation by the coil magnetic field, and thus also enable improving repeated reproducibility. The last discharge stop step (30b) enable suppressing potential variations at the time of shutoff of discharge (at the step 31b) by controlling the neutralization current and the high-frequency power so as to reduce them (at the step 33). This effect is an effect obtained by an increase in the amount of supply of positive ions and the suppression of the diffusion of the plasma and the neutralization current, which is achieved by the application of the positive potential to the first electrode 307 and the supply of the coil current at the time of the shutoff of the discharge (at the step 31b).

Other Embodiments

In the above-described embodiment, the ion beam etching has been described as the ion beam processing; however, the present invention may be applied to any form, provided that the processing is processing using an ion beam, such as ion implantation.

Still Other Embodiments

In one embodiment of the present invention, the controller 7 may be configured by a computer. In this case, a computer program including the steps 10b, 20b and 30b in FIG. 5B is stored in a memory unit provided in the computer, and a CPU (central processing unit) provided in the computer reads out a control program stored in the memory unit thereby to execute processing indicated by the steps 10b, 20b and 30b.

Also, a processing method as given below is included in the scope of the above-mentioned embodiment. In the processing method, a program which operates the configuration of the above-mentioned embodiment so as to implement the function of the above-mentioned embodiment is stored in a storage medium, the program stored in the storage medium is read out as code, and the program is executed by the computer. In other words, a computer-readable storage medium is also included in the scope of the embodiment. Also, the computer program in itself, as well as the storage medium storing the above-mentioned computer program, is included in the above-mentioned embodiment.

A floppy disk (which is a registered trademark), a hard disk, an optical disk, a magneto-optical disc, CD-ROM (compact disc read only memory), magnetic tape, a non-volatile memory card, or ROM (read only memory), for example, may be used as such a storage medium. Also, besides a configuration in which processing is executed by the program alone stored in the above-mentioned storage medium, a configuration as given below is included in the scope of the above-mentioned embodiment. In the configuration, the program cooperates with other software or a function of an expansion board thereby to operate on an OS (operating system) and execute the operation of the above-mentioned embodiment.

What is claimed is:
1. An ion beam processing method for processing a substrate placed in a processing chamber linked to a plasma generation chamber by irradiating the substrate with an ion beam extracted and formed from plasma generated in the plasma generation chamber having an internal space, comprising:
applying a positive voltage for extracting ions into the processing chamber to a first electrode disposed facing the internal space, in a portion of linkage between the plasma generation chamber and the processing chamber, under a first condition where irradiation of the substrate with the ion beam is blocked off by a shutter;

forming a magnetic field in the plasma generation chamber by an electromagnet under the first condition;

generating the plasma in the internal space under the first condition;

forming the ion beam by forming, under the first condition, a second condition where a positive voltage is applied to the first electrode and a negative voltage is applied to a second electrode disposed closer to the processing chamber than the first electrode, in the portion of linkage; and moving the shutter and processing the substrate by irradiating the substrate with the ion beam, wherein during formation of the plasma, the magnetic field is formed in the plasma generation chamber by the electromagnet, and wherein a current supplied to the electromagnet in forming the magnetic field is set higher than a current supplied to the electromagnet during the formation of the plasma.

2. The ion beam processing method according to claim 1, wherein processing the substrate includes continuously reducing the current supplied to the electromagnet during movement of the shutter.

3. The ion beam processing method according to claim 1, wherein in applying the positive voltage, the positive voltage for extracting the ions into the processing chamber is applied to the first electrode, and the positive voltage is applied to the first electrode continuously in applying the positive voltage, generating the plasma and forming the ion beam.

4. The ion beam processing method according to claim 3, wherein the positive voltage applied to the first electrode in applying the positive voltage is greater than the positive voltage applied to the first electrode in forming the ion beam.

5. An ion beam processing apparatus comprising:
a plasma generation chamber having an internal space;
a processing chamber linked to the plasma generation chamber;
a plasma generation unit configured to generate plasma in the internal space;
an extraction unit configured to extract ions from the plasma in the internal space into the processing chamber, the extraction unit including a first electrode and a second electrode each having ion passage holes for passage of the ions, the first electrode being disposed closest to the plasma generation chamber, the second electrode being disposed closer to the processing chamber than the first electrode is;
a substrate holding unit disposed in the processing chamber, having a substrate holding surface for holding a substrate, and being disposed so that an ion beam extracted and formed from the extraction unit is incident on the substrate holding unit;
a shutter disposed between the extraction unit and the substrate holding unit, and configured to move between a first position in which the ion beam is blocked off from the substrate holding surface and a second position in which the ion beam is not blocked off from the substrate holding surface;
a voltage supply unit that applies voltages to the first electrode and the second electrode;
a controller configured to control the voltage supply unit so as to apply a positive voltage to the first electrode under a condition where the shutter is in the first position before generation of the plasma and before formation of the ion beam, and apply a positive voltage to the first electrode and a negative voltage to the second electrode during the formation of the ion beam;
an electromagnet configured to generate a magnetic field in the plasma generation chamber; and
a current supply unit that supplies a current to the electromagnet for generating the magnetic field,
wherein the controller is further configured to control the current supply unit so as to supply the current to the electromagnet before the generation of the plasma and before the formation of the ion beam, and
wherein the controller is further configured to control the current supply unit so that the current supplied to the electromagnet before the generation of the plasma and before the formation of the ion beam is set higher than the current supplied to the electromagnet during the formation of the plasma.

6. The ion beam processing apparatus according to claim 5, wherein the controller is further configured to control the current supply unit so that the current supplied to the electromagnet is continuously increased during movement of the shutter from the first position to the second position.

7. The ion beam processing apparatus according to claim 5, wherein the controller is further configured to control the current supply unit so that the current supplied to the electromagnet is continuously reduced during movement of the shutter from the second position to the first position.

* * * * *